(12) United States Patent
Li

(10) Patent No.: US 6,399,224 B1
(45) Date of Patent: Jun. 4, 2002

(54) CONJUGATED POLYMERS WITH TUNABLE CHARGE INJECTION ABILITY

(75) Inventor: Xiao-Chang Charles Li, Sunnyvale, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/515,141

(22) Filed: Feb. 29, 2000

(51) Int. Cl.[7] ............................................... H05B 33/00
(52) U.S. Cl. ...................... 428/690; 428/917; 528/101; 528/205; 528/377; 528/422; 313/504
(58) Field of Search ................................ 428/690, 917; 528/101, 205, 377, 422; 313/504

(56) References Cited

U.S. PATENT DOCUMENTS

| | | | |
|---|---|---|---|
| 5,247,190 A | 9/1993 | Friend et al. ................... | 257/40 |
| 5,558,904 A | 9/1996 | Hsieh et al. .................... | 427/66 |
| 5,777,070 A | 7/1998 | Inbasekaran et al. ......... | 528/394 |
| 5,817,430 A | 10/1998 | Hsieh ........................... | 428/690 |
| 5,858,563 A | 1/1999 | Sano et al. .................... | 428/690 |
| 5,882,761 A | 3/1999 | Kawami et al. ............... | 428/69 |
| 5,935,720 A | 8/1999 | Chen et al. .................... | 428/690 |
| 5,945,502 A | 8/1999 | Hsieh et al. .................. | 528/101 |

OTHER PUBLICATIONS

Kido, Junji et al., "Electroluminescent Poly(arylene ether) Containing Both Hole–Transporting and Electron–Transporting Units", Chemistry Letters, 1996, pp. 161–162.

Li, Xiao–Chang, et al., "Synthesis, Properties, and Application of New Luminescent Polymers with Both Hole and Electron Injection Abilities for Light–Emitting Devices", Chem. Mater., 1999, 11, pp. 1568–1575.

Yu, Wang–Lin, et al., "Synthesis and Characterization of A New p–n Diblock Light–Emitting Copolymer", Macromolecules, 1998, 31, 4838–44.

*Primary Examiner*—Duc Truong
(74) *Attorney, Agent, or Firm*—Fitzpatrick, Cella, Harper & Scinto (57) ABSTRACT

Conjugated polymers and copolymers with strong luminescent properties and balanced charge transporting/injection properties are disclosed. Methods of manufacturing such polymers and copolymers and optoelectronic devices fabricated with such polymers and copolymers are disclosed. A conjugated luminescent polymer with tunable charge transport is prepared according to the following polymerization reaction:

$$mM1 + nM2 \rightarrow (M1)_m(M2)_n$$

wherein M1 is a monomer having at least two reactive functional groups and at least one chemically bonded charge transporting chromophore group possessing electron-withdrawing character and M2 is a monomer having at least two reactive functional groups and at least one chemically bonded charge transporting chromophore group possessing electron-donating character, wherein m and n are stoichiometric quantities of the monomers M1 and M2, respectively, wherein m and n are varied to tune the charge transport property of the conjugated luminescent polymer. The monomers may include aryl, substituted aryl, and/or multiple carbon double bonds so that when polymerized, the resulting polymer has a conjugated backbone. Additional monomer reactants (M3, M4, M5, etc.) can be used in the polymerization reaction. The stoichiometric monomer amounts are varied to tune the charge transport or other electronic properties of the resulting conjugated luminescent polymer.

34 Claims, 3 Drawing Sheets

(1 of 3 Drawing Sheet(s) Filed in Color)

CONJUGATED POLYMERS WITH TUNABLE CHARGE INJECTION ABILITY

TECHNICAL FIELD

The present invention relates to conjugated polymers and copolymers for use in optoelectronic devices containing substituent groups that promote charge transport or charge injection. More particularly, the present invention is drawn to conjugated polymers and copolymers with tunable charge injection and transport ability and to optoelectronic devices fabricated with such polymers and copolymers.

BACKGROUND ART

Semi-conducting conjugated polymers combine the features of low cost polymer processing with attractive optoelectronic properties. Electroluminescent devices based on poly(p-phenylene vinylene) (PPV) were first described by Burroughes et al. in 1990 [Burroughes, J. H., et al., Nature, vol. 347, pp. 539–41, 1990]. The light emission in this system is based on the formation of singlet exciton as a result of double charge injection into the emissive polymer. Numerous conjugated polymers have been reported to be highly luminescent materials suitable for light-emission applications [Kraft, A., et al., Angew. Chem. Int. Ed, vol. 37(4), pp. 402–28, 1998]. With appropriate device engineering, PPV based conjugated polymers can also be employed as the active material to produce photovoltaic current under light irradiation. [Granstrom, M., et al., "Laminated Fabrication of Polymeric Photovoltaic Diodes," Nature, vol. 395 (6699), pp. 257–60, 1998].

An electroluminescent or light-emitting device (LED) is usually obtained by sandwiching a conjugated polymer thin film between two electrodes. In order to see the light emission, at least one of the electrodes should be transparent, and in most cases indium-tin oxide (ITO) coated on either a glass substrate or a plastic substrate is used. ITO is normally used as the anode due to its high work function. A low work function metal, such as magnesium, calcium, or aluminum, is usually used as the cathode metal electrode. Under a forward bias (anode wired to positive and cathode wired to negative), electrons are injected into the lowest unoccupied molecular orbital (LUMO, or the lowest position of the conduction band), and holes are injected into the highest occupied molecular orbital (HOMO, or the highest position of the valence band).

As a result of charge transport, some of the electrons and holes may recombine to form an excited state (called siglet exciton) that is annihilated to produce light emission corresponding to the band gap of the conjugated polymer. When the electrodes and device configuration are fixed, the light emission and emission efficiency of the polymer LED is dependent on the nature of the conjugated polymer.

For most conjugated polymers, hole injection (or p-doping) is more favorable than electron injection (n-doping). The unbalanced charge injection and transporting ability of these conjugated semi-conducting polymers result in low efficiency of polymer LEDs, that is, low conversion of electrons to emitted photons. To enhance electron injection for polymer LEDs, one common method is to use a low work function metal as the anode, such as calcium. One drawback of using calcium is that it is extremely sensitive to air.

One approach to facilitate charge injection and transport is to design double layer polymer LEDs. Such devices can include a charge-transporting layer to facilitate electron injection, coupled with a luminescent polymer layer. The use of an appropriate charge-transporting layer can provide a closer match of the cathode to the LUMO (for electron injection) or a closer match of the anode to the HOMO (for hole injection) to facilitate easy charge injection (electrons or holes) into the active luminescent material. For instance, in a device of ITO/polymer/electron-transporter/A1, the electron-transporting layer can, on the one hand, enhance electron-injection and transporting ability, and on the other hand, block hole penetration to the A1 cathode.

Many researchers have been developing new luminescent polymers with enhanced electron affinity. Adding strong electron affinity groups, e.g., cyano, onto a PPV backbone exemplifies efforts to lower the LUMO of a polymer and enhance the electron injection ability. With enhanced electron injection of luminescent polymers, air stable metals, such as aluminum, can be used without loss of electroluminescent efficiency. [N. C. Greenham et al., Nature, vol. 365, pp. 628–30, 1993.] Other luminescent polymers containing electron deficient heterocycles, like oxadiazoles, oxathiazole, pyridine, etc., have been exemplified as electron transporting and hole blocking materials. [X.-C Li, et al., "Synthesis and Properties of Novel High Electron Affinity Polymers for Electroluminescent Devices," ACS Symposium Series, vol. 672, pp. 322–44, 1997.] Due to "over tuning" of the electron affinity in these high electron affinity conjugated polymers, hole transporting materials must be used to achieve high efficiency electroluminescence.

To improve the performance of luminescent conjugated polymers with balanced charge injection transporting ability, some researchers have used polycondensation polymerization methods to obtain conjugated polymers containing bipolar pairs of oxadiazoles/triamine [J. Kido, et al., Chem. Lett., p. 161, 1996], oxadiazoles/carbazole [Z. Peng, et al., Chem. Mater., vol. 10, pp. 2086–90, 1998], oxadiazoles/thiophene [W. L. Yu, et al., Macromolecules, vol. 31, pp. 4838–44, 1998], and cyano/triaryl amine [X.-C. Li, et al., Chem Mater., vol 11, pp. 1568–75, 1999]. The general principle of this method can be described in Equation 1, below:

$$nM1 + nM2 \rightarrow (M1M2)_n \qquad (1)$$

The success of this method $(M1M2)_n$ depended on the selection of a suitable pair of bipolar moieties that provided the desired balance of charge injection/transport ability. Furthermore, polycondensation reactions between two different monomer moieties are not easily or economically used to obtain luminescent polymers with controlled charge transporting ability. Copolymers have been considered as an alternative approach to modify the final polymer properties, such as mechanical strength, and to provide a good balance between rigid strength and flexible toughness of a polymer. However, because the monomers used have been principally vinyls, the resulting polymers are not conjugated polymers. [X.-C. Li, et al., Adv. Mater., vol. 11, p. 898, 1995.]

It will be appreciated that there is a need in the art for conjugated polymers and copolymers that can be synthesized with tailored charge injection and transport ability. It will be further appreciated that there is a need for such conjugated polymers and copolymers in the fabrication of optoelectronic devices.

DISCLOSURE OF THE INVENTION

The present invention is directed to conjugated polymers and copolymers combining strong luminescent properties and balanced charge transporting/injection properties. The present invention also includes methods of manufacturing such polymers and copolymers, and to optoelectronic devices fabricated with such polymers and copolymers.

Contrary to the reaction of equation 1, which requires a 1:1 ratio of monomers M1 and M2, the present invention provides a conjugated luminescent polymer with tunable charge transport prepared according to the following polymerization reaction:

$$mnM1+nM2 \rightarrow (M1)_m(M2)_n \qquad (2)$$

wherein M1 is a monomer having at least two reactive functional groups and at least one chemically bonded charge transporting chromophore group possessing electron-withdrawing character and M2 is a monomer having at least two reactive functional groups and at least one chemically bonded charge transporting chromophore group possessing electron-donating character, wherein m and n are stoichiometric quantities of the monomers M1 and M2, respectively, wherein m and n are varied to tune the charge transport property of the conjugated luminescent polymer.

The monomers preferably are aromatic compounds or hetero-aromatic compounds with at least two reactive functional groups. The functional groups are selected to be self-polymerizable and/or co-polymerizable with another co-monomer under certain chemical and physical conditions. The monomers preferably include aromatic or hetero-aromatic ring(s), like aryl, substituted aryl, benzene, substituted benzene, naphthalene, substituted naphthalene, fluorene, substituted fluorene, thiophene, substituted thiophene, pyridine, substituted pyridine, quinoline, substituted quinoline, oxadiazole, triazole, thiazole, benzothiazole, benzothiophene, and/or multiple carbon double bonds such as vinyl, substituted vinyl, acetyne, etc.

By varying the ratio of different monomers (M1, M2, M3, etc.), the total balance between electron and hole transport can be readily tuned as desired. Electron-withdrawing and/or electron-rich groups or chromophores are chemically linked to the conjugated polymers/copolymers as side functional groups. Statistic copolymers of conjugated polymer segments with electron withdrawing and electron-rich side chromophores provide easy fine-tuning of charge transporting/injection ability for the luminescent polymers.

Typical reactive functional groups include, but are not limited to, halide, aldehyde, nitrile methyl, halide methyl, sulfonium methyl, boronic acid, boronic ester, amino, hydroxide, thiol, ethylene, acetyne, trimethyl silane, trimethyl tin, lithium, Grignard group, and chlorosilane. Examples of some currently preferred functional groups include chloromethyl, bromomethyl, and sulfonium methyl which allow 1,6-polymerization by the formation of p-xylylenes to form a conjugated polymer of poly(a rylene vinylene). The reactive functional groups are preferably the same or chemically similar on each monomer to allow polymerization and/or copolymerization reaction between monomers according to the stoichiometric quantity of each monomer. As used herein, chemically similar functional groups mean that the functional groups have the same or analogous chemical reactivity under the equivalent chemical and physical conditions. Similar functional groups also include functional groups that may undergo a chemical change to form the same or very similar reactive intermediates or follow the same chemical reaction mechanism. One example of chemically similar functional groups includes halide substituent groups, such as chloro- and bromo- or other known leaving groups.

The monomer reactants may be chemically linked with one or more functional substituents that enhance either electron transporting or hole transporting. The monomer reactants may also include a solubilizing functional group such as alkyl, alkoxy, silane, aryl, or heteroaryl.

Some typical electron-withdrawing charge transporting chromophore groups that may be used in accordance with the present invention include, but are not limited to, aromatic oxadiazoles, heteroaromatic rings, cyano groups, and mixtures thereof combined with phenyl or vinyl double bonds. Examples of some currently preferred heteroaromatic rings include pyridine, quinoline, oxadiazole and quinoxaline.

Some typical electron-donating charge transporting chromophore groups that may be used in accordance with the present invention include, but are not limited to, benzene, aromatic amines, carbazoles, thiophenes, farans, and mixtures thereof combined with phenyl or vinyl double bonds.

Additional monomer reactants (M3, M4, M5, etc.) can be used in the polymerization reaction. Preferably from two to four monomer reactants are used, but up to ten monomer reactants can be used. When another monomer reactant M3, present at a stoichiometric quantity p, is used the resulting luminescent polymer has the formula $(M1)_m(M2)_n(M3)_p$. When yet another monomer reactant M4 is used, the resulting luminescent polymer has the formula $(M1)_m(M2)_n(M3)_p(M4)_q$. The monomers M3, M4, etc. have at least two reactive functional groups and at least one chemically bonded charge transporting chromophore group possessing either electron-withdrawing or electron-donating character. The stoichiometric amounts m, n, p, q, etc. are varied to tune the charge transport property of the resulting conjugated luminescent polymer.

The present invention is also directed to organic electronic devices containing the foregoing conjugated semiconducting polymers. Such devices typically include at least one thin film of the conjugated polymer coupled to a pair of electrodes. Additional thin films of conjugated luminescent polymer can be used. In such cases, one thin film may be configured to promote electron transport and a second thin film may be tuned to promote hole transport. When the organic luminescent device is fabricated with a plurality of thin films of conjugated luminescent polymer, the thin films are preferably tuned to promote balanced electron and hole transport between the first and second electrodes. Typical organic electronic devices include, but are not limited to, a LED, a thin film transistor, a photovoltaic solar cell, an electrochemical luminescent display device, an electrochromic display device, and an electroluminescent device for active flat-panel display applications.

BRIEF DESCRIPTION OF THE DRAWINGS

The file of this patent contains at least one drawing executed in color. Copies of this patent with color drawings will be provided by the Patent and Trademark Office upon request and payment of the necessary fee.

DETAILED DESCRIPTION OF THE PREFERRED EMBODIMENTS

The present invention provides a process of preparing a luminescent conjugated polymer having directly bonded substituent groups to facilitate charge injection and charge transport functionality. The substituent groups preferably include electron-withdrawing or electron-donating groups. The process of the present invention provides an easy and versatile method to prepare conjugated copolymers having bright luminescence and balanced charge injection and charge transport properties. The conjugated polymer can be coated as a thin film for use in a multi-layer optoelectronic device for luminescent light-emission, such as a light-emitting device (LED) for active flat-panel display applications, an electrochemical light emitting device, an electrochromic display device, and/or photovoltaic devices. The semi-conducting polymer may have a band gap of from 3.4 eV to 2.0 eV, and may comprise a conjugated backbone with strong luminescent property in solution and/or in solid state.

The semi-conducting polymer has at least a conjugated segment (with a conjugation length preferably of at least 5 double bonds) along the backbone, but preferably is fully conjugated. The conjugated backbone provides a highly delocalized π system having efficient luminescent properties and excellent thermal, mechanical, and electrical properties. The backbone preferably consists of aromatic rings and/or substituted aromatic rings, hetero-aromatic rings and/or substituted hetero-aromatic rings, vinyl and/or substituted vinyl. The conjugated polymer may be chemically linked with suitable substitutions that can assist charge injection and transportation, and/or enhance solubility in conventional solvents.

The monomers preferably are aromatic compounds or hetero-aromatic compounds with at least two reactive functional groups. The functional groups are selected to be self-polymerizable and/or co-polymerizable with another co-monomer under certain chemical and physical conditions. The monomers preferably include aromatic or heteroaromatic ring(s), like aryl, substituted aryl, benzene, substituted benzene, naphthalene, substituted naphthalene, fluorine, substituted fluorine, thiophene, substituted thiophene, pyridine, substituted pyridine, quinoline, substituted quinoline, oxadiazole, triazole, thiozole, benzothiazole, benzothiophene, and/or multiple carbon double bonds such as vinyl, substituted vinyle, acetyne, etc. Scheme 1 illustrates some typical monomer units that can be used to prepare the conjugated polymers according to the present invention.

Scheme 1: Representative monomer units

X is H, $C_1$ to $C_{20}$ alkyl, $C_1$ to $C_{20}$ alkoxy, aryl, silane, or siloxy.
R is a charge transporting chromophore. Y is O, S, NH, Se, or $SO_2$.

X, Y: CN, COOH, $SO_3H$, $SO_3K$, $SO_3Na$, $SO_3Li$, COOR, F, Cl, Br, I (R = alkyl, alkoxyl, silyl, germanium alkyl)

Several charge transporting chromophore units "R" of Scheme 1 are represented in Schemes 2 and 3, below. The charge transporting chromophores preferably include conjugated segments that will be easily electronically reduced (n-doping) or oxidized (p-doping) to form radical cations or radical anions. For hole transporting chromophores, electron donating group(s), heteroaromatic rings, aromatic amine(s) are major constituents. Scheme 2 includes examples of typical hole transporting construction units for hole transporting chromophores that can be substituents of the monomers used to prepare the conjugated polymers within the scope of the present invention. The illustrated compounds are given by way of example only. Persons skilled in the art will appreciate that other known and novel hole transport moieties can be used in the present invention, including, but are not limited to, organic compounds having electron donating properties, such as aromatic amines, carbazoles, thiophenes, poly(N-vinyl-carbazole), polythiophene derivatives, and others.

Scheme 2: Hole transporting chromophore units

X is aryl, alkyl (C$_1$ to C$_{20}$), and alkoxy (C$_1$ to C$_{20}$).

Electron transporting chromophores are usually composed of highly electron-withdrawing group(s), electron-withdrawing heteroaromatic ring(s), or their combinations. Scheme 3 includes examples of typical electron transporting construction units for electron-transporting chromophores that can be substituents of the monomers used to prepare the conjugated polymers within the scope of the present invention. The illustrated compounds are given by way of example only. Persons skilled in the art will appreciate that other known and novel electron transport moieties can be used in the present invention, including but not limited to, organic compounds containing electron withdrawing properties such as aromatic oxadiazoles, triazoles, and quinolines, or their combination.

Scheme 3: Electron transporting chromophore units

X, X$_1$, and X$_2$ is aryl, alkyl (C$_1$ to C$_{20}$), and alkoxy (C$_1$ to C$_{20}$).

The side groups illustrated above that provide charge transporting/injection ability are chemically bonded to the semi-conducting polymer, preferably linked directly with the conjugated backbone, to effectively influence the energy level of the conjugated polymer. With the use of some electron rich groups (Scheme 2) as the side groups, such as aromatic amines, chromophores containing pyrrole and thiophene rings, chromophores containing carbazoles or fused aromatic rings, the HOMO (the highest occupied molecular orbital) is effectively raised and thus to ease hole injection and transporting ability of the conjugated polymer. With the use of some high electron affinity groups (Scheme 3), such as aromatic oxadiazoles, cyano groups, the LUMO (the lowest unoccupied molecular orbital) of the conjugated polymer is effectively lowered and thus raises the ability for electron injection and transporting.

While homo-polymers with both strong luminescent property and charge transporting/injection property may be used as the active layer and/or merely charge transporting layer in the construction of polymer LEDs, copolymers are preferably used as the active layer and/or charge transporting layer. Surprisingly, this invention demonstrates that by means of co-polymerization, the nature of the conjugated polymer can be tuned to provide a strong electron affinity and/or strong electron rich property, and preferably with a balanced electron and hole injection/transporting ability. This allows the fabrication of a single polymer layer LED having a "gradient energy level" that provides high performance similar to a double layer LED.

Figure 1:
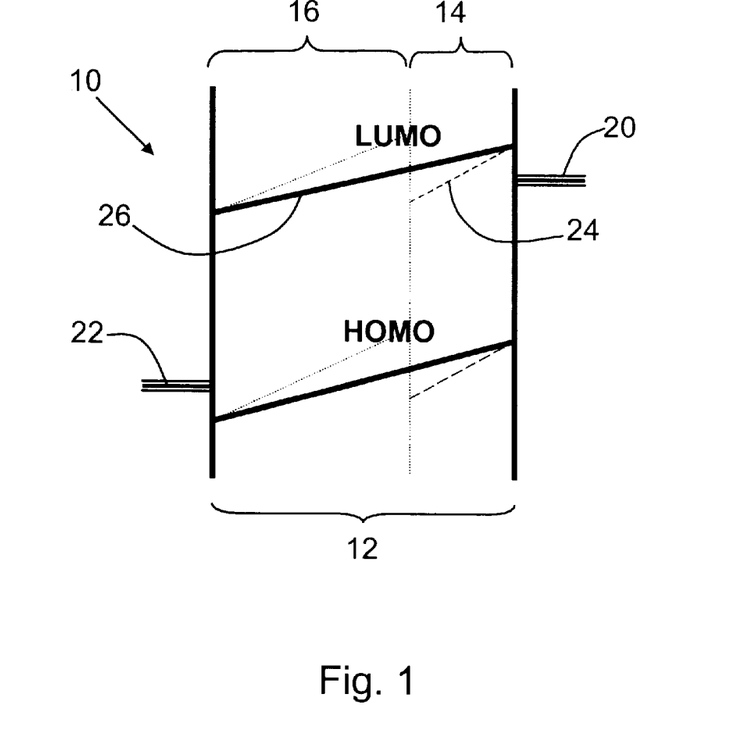
FIG. 1 is a schematic illustration of an energy level diagram for a single layer LED device (solid line) with fine-tuned charge-transporting property. A comparable double layer device having an electron-transport layer is shown with a dotted line.

FIG. 1 shows the energy level diagram for a polymer LED 10 containing a single layer 12 of conjugated polymer having fine-tuned charge transporting property. By contrast, a comparable double-layer device employing a separate electron-transporting layer 14 and emissive polymer layer 16 is shown in dashed lines. The device 10 includes a conventional cathode 20 and anode 22. Line 24 shows a typical energy level gradient for the electron-transporting layer 14, and line 26 shows a typical energy level gradient for the single-layer conjugated polymer layer 12.

The fine-tuning of charge transporting ability between electrons and holes is embodied by changing the electron-withdrawing/electron-rich pair and by changing the ratio of the segments. The co-polymerization type may be represented by equation 2.

$$mM1+nM2+pM3 \rightarrow (M1)_m(M2)_n(M3)_p \tag{2}$$

Wherein M1, M2 and M3 are organic molecules having at least two reactive functional groups and at least one chemically bonded side groups that show either electron-withdrawing or electron-rich properties. M3 is a molecule having at least two reactive groups to form conjugated polymer chain. Typical reactive functional groups include, but are not limited to, halide, aldehyde, nitrile methyl, halide methyl, sulfonium methyl, boronic acid, boronic ester, amino, hydroxide, thiol, ethylene, acetyne, trimethyl silane, trimethyl tin, lithium, Grignard group, and chlorosilane. The reactive functional groups are preferably the same or chemically similar on each monomer to allow polymerization reaction between monomers according to the stoichiometric quantity of each monomer. As used herein, chemically similar functional groups mean that the functional groups have similar chemical reactivity under the same chemical and physical condition. Similar functional groups also mean that the functional groups may subject a chemical change to form the same or chemically equivalent reactive intermediates, and follow with the same chemical reaction mechanism. One example of chemically similar functional groups includes halide substituent groups, such as chloro- and bromo-. For instance, a 1,4-bis(bromomethyl benzene) may be used to copolymerize with 1,4-bis(chloromethyl benzene) to generate a copolymer within the scope of the present invention, as illustrated below:

+

Where $R_1$ and $R_2$ are charge transport moieties, such as electron-withdrawing or electron-donating groups.

One useful polymerization reaction that can be used in accordance with the present invention is 1,6-polymerization by the formation of p-xylylenes to form a conjugated polymer of poly(arylene vinylene). A general scheme is depicted as follow:

Where L is a leaving group, such as Cl, Br, I, sulfonium, sulfone, xanthate; and Ar is a charge-transport substituted phenyl, thiophene, furane, naphthalene, and substituted forms thereof. Preferably, the functional groups are selected from chloromethyl, bromomethyl, and sulfonium methyl that allow polymerization under base condition.

The polymers may be synthesized through co-polymerization with several similar monomers with controlled electron-affinity or electron-donating properties.

EXAMPLES

The following examples are given to illustrate various embodiments within the scope of the present invention. These are given by way of example only, and it is to be understood that the following examples are not comprehensive or exhaustive of the many embodiments within the scope of the present invention.

Example 1

The preparation of a PPV luminescent polymer through the sulfonium precursor route.

Synthesis of PPV precursor polymer. PPV sulfonium precursor was prepared according to a modified procedure as follows: Xylylenebis-p,-(tetrahydrothiophenium chloride) (5.0 g, 14 mmol) was dissolved in dry methanol (35 ml) and cooled to 0° C. The solution was degassed by nitrogen bubbling for ca. 20 minutes before the addition of degassed sodium hydroxide solution (0.4 M, 34.3 ml). The solution became viscous during the addition period of 30 minutes. The reaction mixture was stirred at 0° C. for 1 h, and neutralized by adding dilute hydrochloric acid. The polymer solution was dialysed against water over 3 days at 5° C. (water was changed 3 times) to remove inorganic impurities and small molecular weight oligomers. The polymer yield was about 60 %. The polymer solution was ready for spin-coating at 2500 rpm to form thin polymer film.

LED fabrication of PPV polymer. The obtained PPV precursor polymer solution was used to form a colorless uniform thin film by spin-coating on cleaned ITO glass. After spin-coating, the thin film which was thermally converted (at 250° C. for 5 hours under argon) resulting in a fully conjugated PPV film (yellow color). The thickness of the PPV film was about 100 nm. A layer of aluminum film was deposited on top of the PPV film under thermal evaporation (thickness of 1000 nm) to produce a single layer LED device, such as the device illustrated in FIG. 2. The LED device 30, shown in FIG. 2, includes a clear substrate 32 having an ITO coating that serves as the anode 34. The single layer of luminescent polymer 36 is shown between the ITO anode 34 and the aluminum cathode 38. An electrical potential 40 connects the anode 34 and cathode 38. With such a single layer device and aluminum as cathode, the device emitted dim green light with a maximal wavelength of 525 nm under daylight condition. The measured brightness at a voltage of 5 V was 370 cd/m$^2$.

Example 2

The preparation of PPV bonded with electron-transporting aromatic oxadiazole side chromophore, specifically an aromatic oxadiazole substituted PPV was designed and prepared according to Scheme 4.

Scheme 4: Precursor route for oxadiazole substituted PPV

Yellow fluorescent with band gap of 2.48 eV and PL λ = 554 nm

Synthesis of 2-(4-tert-butyl-phenyl)-5-(-2,5-dimethyl-phenyl)-[1,3,4]oxadiazole (3)

2,5-dimethyl-carboxylic acid benzene (Aldrich, 6.90 g, 46.1 mmol) and 4-t-butylbenzoic hydrazide (Aldrich, 8.86 g, 46.1 mmol) were dissolved in the mixture of phosphorus pentaoxide (2.0 g, 7.0 mmol) and methylsulfonic acid (30 ml) under nitrogen atmosphere. The mixture was heated to 80° C. and stirred for 6 hours. After cooling the mixture to room temperature, it was poured into water (300 ml). The mixture was extracted with ether (3×70 ml), and the combined ether solution was washed with dilute potassium carbonate solution and water respectively. The product was purified by silica flash column chromatography using hexane to hexane/ether (1:3, v/v) subsequently, and a white solid powder was obtained (9.5 g, 68%). The compound was characterized by $^1$H NMR and FT-IR.

Synthesis of 2-(2,5-bis-chloromethyl-phenyl)-5-(4-tert-butyl-phenyl)-[1,3,4]oxadiazole (4)

Compound 3 (3.0 g, 9.79 mmol) and N-chlorosuccinimide (3.27 g, 24.48 mmol) were dissolved in carbon tetrachloride (20 ml). The mixture was degassed and heated/irradiated by an IR lamp to reflux under argon. After 4 hours, the mixture was cooled to 0° C. The soluble part of the mixture was separated by filtration. Evaporation of the solvent afforded a solid mixture product, which was separated and purified by silica flash column chromatography using hexane to hexane/EtOAC (1:4, v/v) subsequently. The product was obtained as an off-white powder with a yield of 42%. The compound was characterized by $^1$H NMR and FT-IR.

Synthesis of (2-(4-tert-butyl-phenyl)-[1,3,4]oxadiazole)-xylylene-bis-p-(tetrahydrothiophenium chloride) (5)

Compound 4 (2.3 g, 6.13 mmol) and tetrahydrothiophene (THT) (2.7 g, 30.65 mmol) were dissolved in methanol (110 ml) and heated to reflux. The mixture was stirred for 14 hours under refluxing condition before cooling down to room temperature. The solvent and the excess of THT were removed by evaporation under vacuum at room temperature, and the product was washed by dry dichloromethane twice (2×10 ml). The product was obtained as a white solid powder with a yield of 75%.

Figure 3:
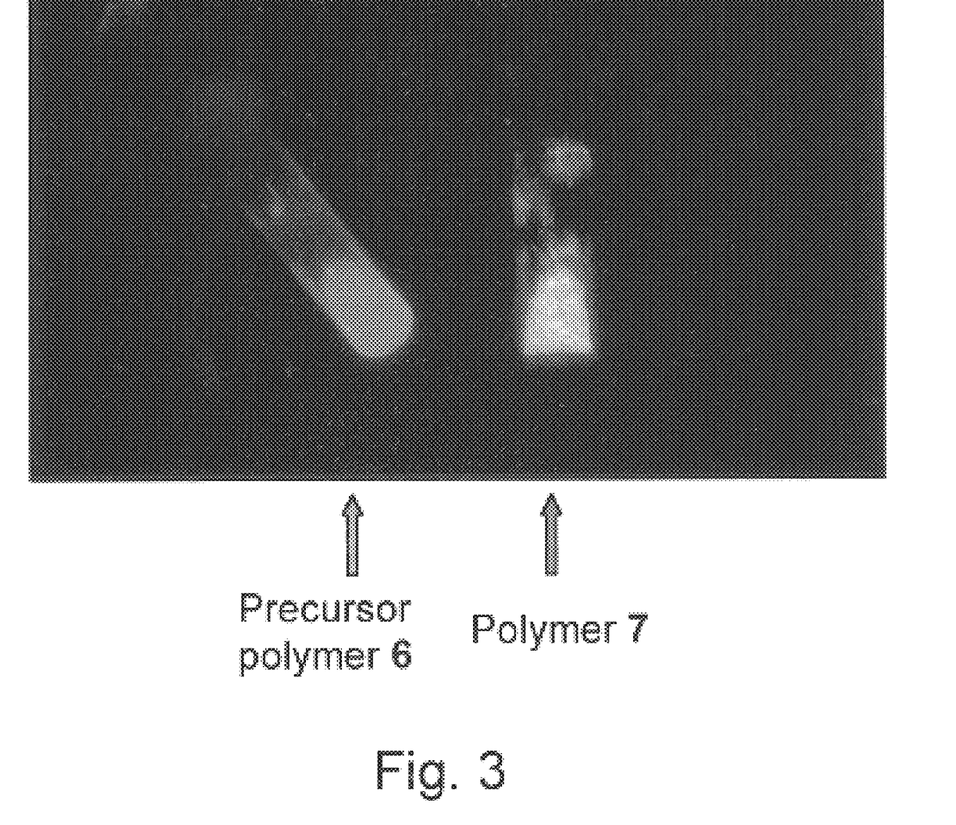
FIG. 3 is a photograph comparing the luminescence of the precursor polymer 6 with the fully converted conjugated polymer 7.
Figure 4:
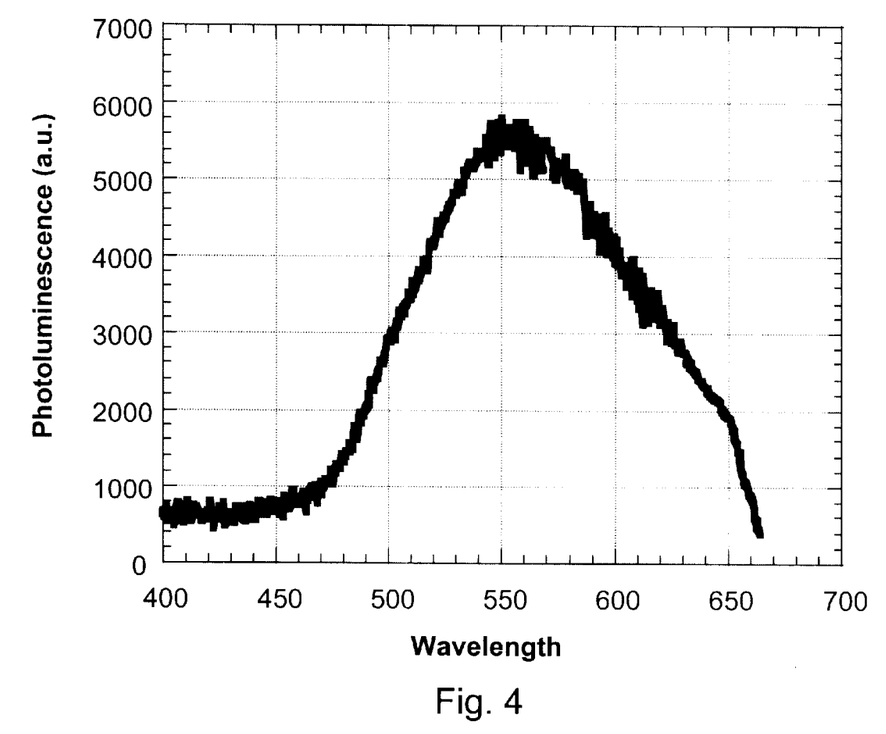
FIG. 4 is a graph of the photoluminescence spectrum of polymer 7.

Synthesis of aromatic oxadiazole substituted PPV precursor 6. The preparation procedure was similar as in Example 1, except using 5 as the monomer. The polymer precursor was obtained with a yield of 45%. The precursor polymer 6 presents blue luminescence, and its fully converted conjugated polymer 7 presents bright yellow, as shown in FIG. 3. FIG. 4 shows the photoluminescent spectrum of the polymer 7.

Figure 2:
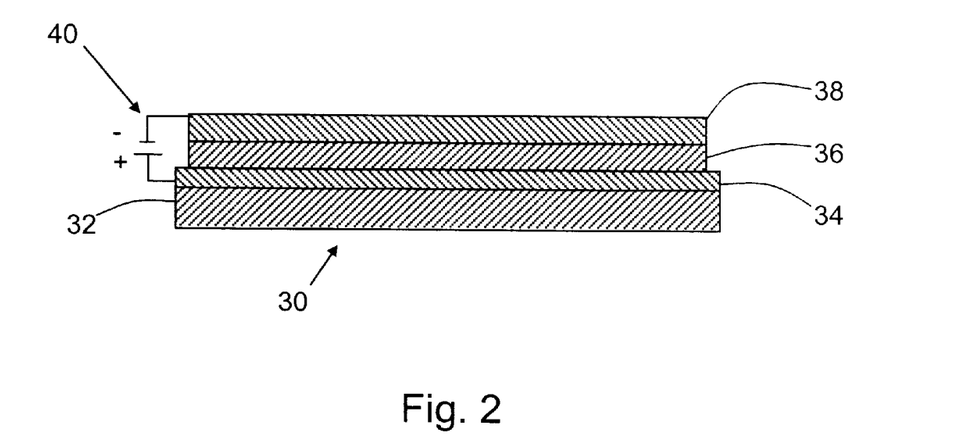
FIG. 2 is a cross-section illustration of a typical single layer light emitting device, Glass/ITO/Luminescent polymer/Al.

LED fabrication of OX-PPV polymer. The obtained OX-PPV precursor polymer (6) solution was spin-coated on a cleaned ITO glass substrate to form a colorless uniform thin film which was then thermally converted (at 250° C. for 5 hours under argon) to produce a fully conjugated OX-PPV film (yellow color). The thickness of the OX-PPV film was about 100 nm. A layer of aluminum film was deposited on top of the PPV film under thermal evaporation (thickness of 1000 nm), resulting in a single layer LED device configured as shown in FIG. 2. Due to the enhancement of electron-transporting ability of the oxadiazole chromophore, the device emitted bright green light with a maximal wavelength of 555 nm under daylight condition. The measured brightness was 650 cd/m$^2$ at a voltage of 5 V, which is brighter than the standard PPV device as described in Example 1.

Example 3

PPV-OX-PPV copolymer.

Synthesis of PPV-OX-PPV copolymer. The preparation procedure was similar as Example 1, except using 5 and xylylenebis-p-(tetrahydrothiophenium chloride) (1:1 mole ratio) as the monomers (Scheme 5). The co-polymer precursor was obtained with a yield of 65%, which is higher than Example 2. The precursor co-polymer 8 presented blue luminescence, and its fully converted conjugated polymer 9 presented greenish yellow.

LED fabrication of PPV-OX-PPV polymer. The copolymer was used to fabricate single layer device, ITO/PPV-OX-PPV/A1, according to the procedure described in Example 1. More stable and bright, greenish yellow electroluminescence was observed for the copolymer device. Compared with polymer 7, the copolymer has a better film formation property and a well-balanced charge-transporting property, since PPV has a good hole-transporting ability and oxadiazole-substituted PPV (OX-PPV) has enhanced electron-transporting ability. The measured brightness was 950 cd/M$^2$ at a voltage of 5 V, which is brighter than the OX-PPV device as described in Example 2.

Scheme 5: A copolymer with a balanced charge-transporting ability

Example 4

Soluble OX-PPV luminescent polymer with electron-transporting side chromophores. To obtain soluble conjugated polymer with electron-transporting ability, a new polymer with a long alkoxyl substituted OX-PPV was prepared according to Scheme 6.

Synthesis of 4-nonyloxy-benzoic acid N'-(2,5-dimethyl-benzoyl)-hydrazide.(12)

2,5-dimethyl-carboxylic acid benzene (Aldrich, 2.56 g, 17.2 mmol) and thionyl chloride (15 ml) was heated to reflux under nitrogen for 4 hours. The extra thionyl chloride was removed by evaporation under vacuum at elevated temperature. The rough acid chloride product was recrystallized from hexane to afford the pure acid chloride (97%). The acid chloride was dissolved in dry chloroform (50 ml), and 4-nonyloxy-benzoic acid hydrazide (4.5 g, 17.02 mmol) was added, followed with the addition of triethyl amine (1.48 g). The mixture was stirred for 10 hours at room temperature, and then poured into ice water (120 ml). The mixture was extracted with ethyl acetate (4×50 ml), and the combined ethyl acetate solution was dried over sodium sulfate. After evaporation of ethyl acetate, the solid powder was purified by re-crystallization in ethanol to give the white hydrazide product (88%, 6.1 g).

Synthesis of 2-(2.5-dimethyl-phenyl)-5-(4-nonyloxy-phenyl)-[1,3,4]oxadiazoles (13)

The hydrazide 12 (6.1 g, 14.96 mmol) was dissolved in POCl$_3$ (20 ml) and heated to reflux under nitrogen. The mixture was stirred for 4 hours. The extra POCl$_3$ was removed by evaporation under vacuum. The residue was washed by ice water and recrystallized in ethanol to give the title off-white product (92 %, 5.4 g).

Synthesis of 2-(2,5-bis-chloromethyl-phenyl)-5-(4-nonyloxy-phenyl)-[1,3,4]oxadiazole (14)

The oxadiazole 13 (5.2 g, 13.25 mmol) and N-chlorosuccinimide (3.89 g, 29.1 mmol) were dissolved in carbon tetrachloride (80 ml). The suspension mixture was heated/irradiated by an IR lamp to reflux. The reaction was carried out for 5 hours and cooled down to room temperature. The mixture was filtered, and the filtrate was dried to give a rough white product that was purified by silica flash chromatograph using hexane to hexane/EtOAC (1:3, v/v) to afford the product (42%, 2.58 g).

Synthesis of poly [2-(4-nonyloxy-phenyl)-[1,3,4] oxadiazole-phenylenevinylene](NPOX-PPV) (15)

The monomer 14 (1.5 g, 3.25 mmol) was dissolved in dry tetrahydrofuran (80 ml) under nitrogen. Potassium tert-butoxide solution (1.0 M in THF, 19.5 ml) was added dropwise over 20 minutes into the solution at room temperature. The clear solution became green and viscous within 30 minutes. The mixture was stirred for 24 hours at room temperature under dark condition. The deep green viscous solution was poured into methanol (500 ml) to give bright yellow precipitate which was re-dissolved in minimal THE (10 ml) and precipitated in methanol again (500 ml). The bright yellow polymer was obtained with a yield of 70% (0.89 g). Gel permeation chromatography measurement revealed $M_n$=80,000 and $M_w$=200,000 da.

Scheme 6: A soluble oxadiazole substituted PPV

Example 5

Soluble NPOX-PPV-co-MEH-PPV.

Poly(2-methoxy-5-(2'ethylhexyloxy)-phenylenevinylene) (MEH-PPV) can be prepared according to published method (F. Wudle, et al, ACS Symposium Ser. 455 (1991): 683–686). It is a red luminescent polymer with preferential hole-transporting capability. The copolymer according to Scheme 7 represent a facile method to fine-tune charge-transpsorting capability for a luminescent conjugated polymer. The copolymerization procedure and purification was similar to Example 4, except using two monomers. For a simple example, the monomer ratio was 14:16=2, a copolymer with generally m:n=2 ratio as judged by $^1$H NMR revealed a similar ratio for the copolymer. The copolymer 17 appeared bright red and luminesced orange red. Electroluminescence with aluminum as cathode can be readily achieved due to the enhancement of electron-injection/transporting property with the introduction of NPOX-PPV.

Scheme 7: A soluble copolymer with oxadiazole substituted PPV and MEH-PPV segments

17

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. A conjugated luminescent polymer with tunable charge transport prepared according to the following polymerization reaction:

$$mM1+nM2 \rightarrow (M1)_m(M2)_n$$

wherein M1 is a monomer having at least two reactive functional groups and at least one chemically bonded charge transporting chromophore group possessing electron-withdrawing character and M2 is a monomer having at least two reactive functional groups and at least one chemically bonded charge transporting chromophore group possessing electron-donating character, wherein m and n are stoichiometric quantities of the monomers M1 and M2, respectively, and wherein m and n are varied to tune the charge transport property of the conjugated luminescent polymer.

2. A conjugated luminescent polymer according to claim 1, wherein the reactive functional groups are selected from halide, aldehyde, nitrile methyl, halide methyl, sulfonium methyl, boronic acid, boronic ester, amino, hydroxide, thiol, ethylene, acetyne, trimethyl silane, trimethyl tin, lithium, Grignard group, and chlorosilane.

3. A conjugated luminescent polymer according to claim 1, wherein the reactive functional groups are chemically similar on each monomer to allow self-polymerization or co-polymerization reaction between the monomers according to the stoichiometric quantity of each monomer.

4. A conjugated luminescent polymer according to claim 1, wherein the reactive functional groups are selected to carry out 1,6-polymerization by the formation of p-xylylene to form poly(arylene vinylene) according to the following reaction:

Where L is a leaving group selected from Cl, Br, I, sulfonium, sulfone, and xanthate; Ar is a charge-transport substituted phenyl, thiophene, furane, naphthalene, or a substituted form thereof.

5. A conjugated luminescent polymer according to claim 4, wherein the functional groups are selected from chloromethyl, bromomethyl, and sulfonium methyl that allow polymerization under base condition.

6. A conjugated luminescent polymer according to claim 1, wherein the conjugated polymer has a conjugated backbone comprising aryl rings, substituted aryl rings, or vinylenes.

7. A conjugated luminescent polymer according to claim 1, wherein the electron-withdrawing charge transporting chromophore group is selected from aromatic oxadiazoles, triazoles, quinolines, heteroaromatic rings, cyano groups, and mixtures thereof combined with phenyl or vinyl double bonds.

8. A conjugated luminescent polymer according to claim 7, wherein the heteroaromatic rings are selected from pyridine, quinoline, and quinoxaline.

9. A conjugated luminescent polymer according to claim 1, wherein the electron-withdrawing charge transporting chromophore group is selected from the following substituent moieties and their combination:

Where X, $X_1$, or $X_2$ is aryl, alkyl ($C_1$ to $C_{20}$), or alkoxy ($C_1$ to $C_{20}$).

10. A conjugated luminescent polymer according to claim 1, wherein the electron-donating charge transporting chromophore group is selected from aromatic amines, carbazoles, thiophenes, furans, and mixtures thereof combined with phenyl or vinyl double bonds.

11. A conjugated luminescent polymer according to claim 1, wherein the electron-donating charge transporting chromophore group is selected from the following substituent moieties and their combination:

Where X is aryl, alkyl ($C_1$ to $C_{20}$), and alkoxy ($C_1$ to $C_{20}$).

12. A conjugated luminescent polymer according to claim 1, wherein the monomer reactants further comprises a solubilizing functional group.

13. A conjugated luminescent polymer according to claim 1, wherein the solubilizing functional group is selected from alkyl, alkoxy, silane, aryl, and heteroaryl.

14. A conjugated luminescent polymer according to claim 1, wherein at least one monomer has a solubilizing functional group selected from alkyl, alkoxy, silane, aryl, and heteroaryl.

15. A conjugated luminescent polymer according to claim 1, wherein the polymerization reaction includes another monomer reactant M3, present at a stoichiometric quantity p, wherein the resulting luminescent polymer has the formula $(M1)_m(M2)_n(M3)_p$, wherein M3 is a monomer having at least two reactive functional groups and at least one chemically bonded charge transporting chromophore group possessing either electron-withdrawing or electron-donating character, wherein m, n, and p are varied to tune the charge transport property of the conjugated luminescent polymer.

16. A conjugated luminescent polymer according to claim 15, wherein the polymerization reaction includes another monomer reactant M4, present at a stoichiometric quantity q, wherein the resulting luminescent polymer has the formula $(M1)_m(M2)_n(M3)_p(M4)_q$, wherein M4 is a monomer having at least two reactive functional groups and at least one chemically bonded charge transporting chromophore group possessing either electron-withdrawing or electron-donating character, wherein m, n, p, and q are varied to tune the charge transport property of the conjugated luminescent polymer.

17. A conjugated luminescent polymer according to claim 16, wherein the polymerization reaction includes other monomer reactants having at least two reactive functional groups and at least one chemically bonded charge transporting chromophore group possessing either electron-withdrawing or electron-donating character, wherein the stoichiometric quantities of the monomer reactants are varied to tune the charge transport property of the conjugated luminescent polymer.

18. A conjugated luminescent polymer according to claim 1, wherein the monomers comprise a core structure selected from benzene, substituted benzene, naphthalene, substituted naphthalene, fluorine, substituted fluorine, thiophene, substituted thiophene, pyridine, substituted pyridine, quinoline, substituted quinoline, oxadiazole, triazole, thiozole, benzothiazole, benzothiophene, vinyl, substituted vinyl, and acetyne.

19. An organic luminescent device comprising:
a first electrode surface;
a first thin film of conjugated luminescent polymer according to claim 1, wherein the luminescent polymer is electrically coupled to the first electrode surface; and
a second electrode, electrically coupled to the conjugated luminescent polymer.

20. An organic luminescent device according to claim 19, wherein the reactive functional groups are selected from halide, aldehyde, nitrile methyl, halide methyl, sulfonium methyl, boronic acid, boronic ester, amino, hydroxide, thiol, ethylene, acetyne, trimethyl silane, trimethyl tin, lithium, Grignard group, and chliorosilane.

21. An organic luminescent device according to claim 19, wherein the reactive functional groups are chemically similar on each monomer to allow self-polymerization or co-polymerization reaction between the monomers according to the stoichiometric quantity of each monomer.

22. An organic luminescent device according to claim 19, wherein the reactive functional groups are selected to carry out 1,6-polymerization by the formation of p-xylylene to form poly(arylene vinylene) according to the following reaction:

poly(arylene vinylene)

Where L is a leaving group selected from Cl, Br, I, sulfonium, sulfone, and xanthate; Ar is a charge-transport substituted phenyl, thiophene, furane, naphthalene, or a substituted form thereof.

23. An organic luminescent device according to claim 22, wherein the functional groups are selected from chloromethyl, bromomethyl, and sulfonium methyl that allow polymerization under base condition.

24. An organic luminescent device according to claim 19, wherein the conjugated polymer has a conjugated backbone comprising aryl rings, substituted aryl rings, or vinylenes.

25. An organic luminescent device according to claim 19, wherein the electron-withdrawing charge transporting chromophore group is selected from aromatic oxadiazoles, triazoles, quinolines, heteroaromatic rings, cyano groups, and mixtures thereof combined with phenyl or vinyl double bonds.

26. An organic luminescent device according to claim 25, wherein the heteroaromatic rings are selected from pyridine, quinoline, and quinoxaline.

27. An organic luminescent device according to claim 19, further comprising a second thin film of conjugated luminescent polymer disposed between the first electrode and the second electrode, wherein the first thin film is tuned to promote electron transport and wherein the second thin film is tuned to promote hole transport.

28. An organic luminescent device according to claim 19, further comprising a plurality of thin films of conjugated luminescent polymer disposed between the first electrode and the second electrode, wherein said plurality of thin films are tuned to promote balanced electron and hole transport between the first and second electrodes.

29. An LED containing the conjugated luminescent polymer according to claim 1.

30. A thin film transistor containing the conjugated luminescent polymer according to claim 1.

31. A photovoltaic solar cell containing the conjugated luminescent polymer according to claim 1.

32. An electrochemical luminescent display device containing the conjugated luminescent polymer according to claim 1.

33. An electrochromic display device containing the conjugated luminescent polymer according to claim 1.

34. An electroluminescent device for flat-panel display containing the conjugated luminescent polymer according to claim 1.

* * * * *